United States Patent
Youssefi

(10) Patent No.: US 12,321,713 B2
(45) Date of Patent: *Jun. 3, 2025

(54) SWITCHED CAPACITOR VECTOR-MATRIX MULTIPLIER

(71) Applicant: Reconceive AI, Inc., San Carlos, CA (US)

(72) Inventor: Behdad Youssefi, Berkeley, CA (US)

(73) Assignee: Reconceive AI, Inc., San Carlos, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/499,124

(22) Filed: Oct. 31, 2023

(65) Prior Publication Data
US 2024/0094985 A1 Mar. 21, 2024

Related U.S. Application Data

(63) Continuation of application No. 17/104,828, filed on Nov. 25, 2020, now Pat. No. 11,842,167, which is a continuation of application No. 16/272,901, filed on Feb. 11, 2019, now Pat. No. 11,055,062.

(60) Provisional application No. 62/629,125, filed on Feb. 12, 2018.

(51) Int. Cl.
*H03M 1/46* (2006.01)
*G06F 7/498* (2006.01)

(52) U.S. Cl.
CPC .......... *G06F 7/4983* (2013.01); *H03M 1/466* (2013.01)

(58) Field of Classification Search
CPC .............. G06F 7/4983; G06F 7/5443; G06F 2207/4814; H03M 1/466
USPC .................................................. 708/620, 625
See application file for complete search history.

(56) References Cited

U.S. PATENT DOCUMENTS

| | | | |
|---|---|---|---|
| 5,325,322 A | 6/1994 | Bailey | |
| 10,389,375 B1 | 8/2019 | Fick et al. | |
| 10,417,460 B1 | 9/2019 | Youssefi | |
| 10,594,334 B1 | 3/2020 | Far | |
| 11,055,062 B1 * | 7/2021 | Youssefi | H03M 1/466 |
| 11,842,167 B2 * | 12/2023 | Youssefi | G06F 7/4983 |
| 2014/0015699 A1 | 1/2014 | Zhao et al. | |
| 2021/0216280 A1 | 7/2021 | Youssefi | |

OTHER PUBLICATIONS

U.S. Final Office Action dated Jan. 26, 2023 in U.S. Appl. No. 17/104,828.
U.S. Corrected Notice of Allowability dated Sep. 24, 2020, in U.S. Appl. No. 16/272,901.

(Continued)

*Primary Examiner* — Tan V Mai
(74) *Attorney, Agent, or Firm* — Weaver Austin Villeneuve & Sampson LLP

(57) ABSTRACT

Methods and apparatuses enable a general-purpose low power analog vector-matrix multiplier. A switched capacitor matrix multiplier may comprise a plurality of successive approximate registers (SAR) operating in parallel, each SAR having a SAR digital output; and a plurality of Analog Multiply-and-Accumulate (MAC) units for multiplying and accumulating and scaling bit-wise products of a digital weight matrix with a digital input vector, wherein each MAC unit is connected in series to a SAR of the plurality of SARs.

9 Claims, 14 Drawing Sheets

(56) References Cited

OTHER PUBLICATIONS

U.S. Ex Parte Quayle Action dated Jun. 18, 2020, in U.S. Appl. No. 16/272,901.
U.S. Notice of Allowance dated Aug. 2, 2023 in U.S. Appl. No. 17/104,828.
U.S. Notice of Allowance dated Aug. 27, 2020, in U.S. Appl. No. 16/272,901.
U.S. Notice of Allowance dated Mar. 10, 2021, in U.S. Appl. No. 16/272,901.
U.S. Notice of Allowance dated May 7, 2019, in U.S. Appl. No. 16/141,817.
U.S. Office Action dated Jan. 7, 2021, in U.S. Appl. No. 16/272,901.
U.S. Office Action dated Oct. 25, 2022 in U.S. Appl. No. 17/104,828.

* cited by examiner

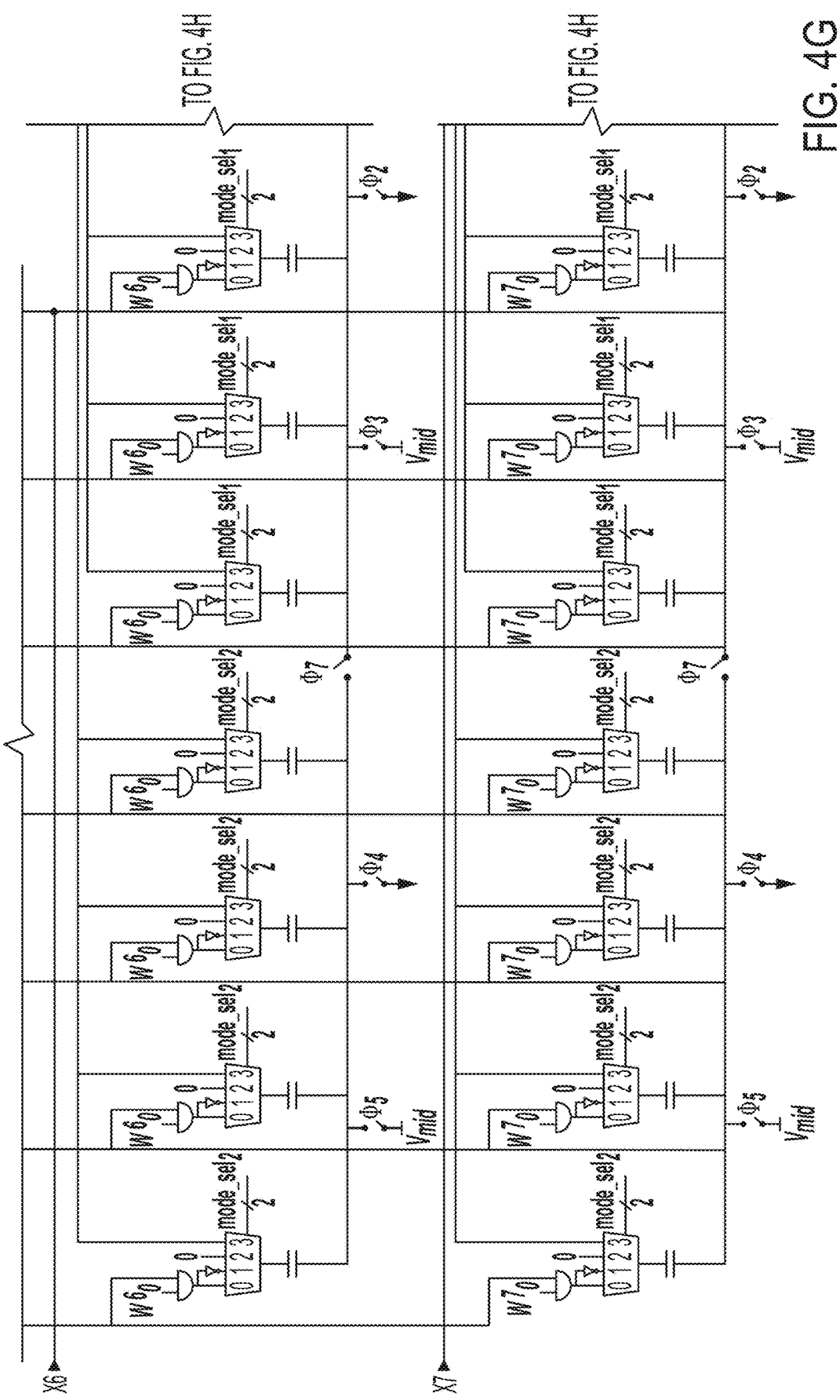

| Worst case error | $1\times2^{-2}$ | $2\times2^{-3}$ | $3\times2^{-4}$ | $4\times2^{-5}$ | $5\times2^{-6}$ | $6\times2^{-7}$ | $7\times2^{-8}$ | $8\times2^{-9}$ | $7\times2^{-10}$ | $6\times2^{-11}$ | $5\times2^{-12}$ | $4\times2^{-13}$ | $3\times2^{-14}$ | $2\times2^{-15}$ | $1\times2^{-16}$ |
|---|---|---|---|---|---|---|---|---|---|---|---|---|---|---|---|
| | $2^{-2}$ | $2^{-3}$ | $2^{-4}$ | $2^{-5}$ | $2^{-6}$ | $2^{-7}$ | $2^{-8}$ | $2^{-9}$ | $2^{-10}$ | $2^{-11}$ | $2^{-12}$ | $2^{-13}$ | $2^{-14}$ | $2^{-15}$ | $2^{-16}$ |
| | | $2^{-3}$ | $2^{-4}$ | $2^{-5}$ | $2^{-6}$ | $2^{-7}$ | $2^{-8}$ | $2^{-9}$ | $2^{-10}$ | $2^{-11}$ | $2^{-12}$ | $2^{-13}$ | $2^{-14}$ | $2^{-15}$ | |
| | | | $2^{-4}$ | $2^{-5}$ | $2^{-6}$ | $2^{-7}$ | $2^{-8}$ | $2^{-9}$ | $2^{-10}$ | $2^{-11}$ | $2^{-12}$ | $2^{-13}$ | $2^{-14}$ | | |
| | | | | $2^{-5}$ | $2^{-6}$ | $2^{-7}$ | $2^{-8}$ | $2^{-9}$ | $2^{-10}$ | $2^{-11}$ | $2^{-12}$ | $2^{-13}$ | | | |
| | | | | | $2^{-6}$ | $2^{-7}$ | $2^{-8}$ | $2^{-9}$ | $2^{-10}$ | $2^{-11}$ | $2^{-12}$ | | | | |
| | | | | | | $2^{-7}$ | $2^{-8}$ | $2^{-9}$ | $2^{-10}$ | $2^{-11}$ | | | | | |
| | | | | | | | $2^{-8}$ | $2^{-9}$ | $2^{-10}$ | | | | | | |
| | | | | | | | | $2^{-9}$ | | | | | | | |
| $\Sigma$ | | | | | | | | | | | | | | | |

FIG. 5

SWITCHED CAPACITOR VECTOR-MATRIX MULTIPLIER

CROSS REFERENCE TO RELATED APPLICATIONS

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Matrix multiplication or matrix product is a binary operation that produces a matrix from two matrices with entries in a field, or, more generally, in a ring or even a semi-ring. The matrix product is designed for representing the composition of linear maps that are represented by matrices. Matrix multiplication is thus a basic tool of linear algebra, and as such has numerous applications in many areas of mathematics, as well as in applied mathematics, statistics, physics, economics, and engineering. In more detail, if A is an n×m matrix and B is an m×p matrix, their matrix product AB is an n×p matrix, in which the m entries across a row of A are multiplied with the m entries down a column of B and summed to produce an entry of AB. When two linear maps are represented by matrices, then the matrix product represents the composition of the two maps.

Computing matrix products is a central operation in all computational applications of linear algebra. Its computational complexity is $O(n^3)$ (for n×n matrices) for the basic algorithm (this complexity is $O(n^{2.373})$ for the asymptotically fastest known algorithm). This nonlinear complexity means that matrix product is often the critical part of many algorithms. This is enforced by the fact that many operations on matrices, such as matrix inversion, determinant, solving systems of linear equations, have the same complexity. Therefore various algorithms have been devised for computing products of large matrices, taking into account the architecture of computers.

Matrix multiplication is at the heart of all machine learning algorithms and is the most computationally expensive task in these applications. Most machine learning implementations use general-purpose CPUs and perform matrix multiplications in serial fashion. The serial computations in the digital domain together with limited memory bandwidth sets a limit on maximum throughput and power efficiency of the computing system.

SUMMARY

Embodiments of the present disclosure are related to a switched capacitor matrix multiplier. In embodiments, the switched capacitor matrix multiplier comprises a plurality of successive approximation registers (SAR). In embodiments, each successive approximation register (SAR) has a successive approximation register (SAR) digital output. In embodiments, the plurality of successive approximation registers (SAR) operate in parallel and a plurality of Analog Multiply-and-Accumulate (MAC) for multiplying and accumulating and scaling bit-wise product of a digital weight matrix with a digital input vector. In embodiments, each Multiply-and-Accumulate unit (MAC) is connected in series to a successive approximation register (SAR) of the plurality of successive approximation registers (SAR).

In embodiments, a successive approximation register comprises a plurality of Multiply-and-Accumulate (MAC) circuits connected in parallel, a comparator, and a state machine.

In embodiments, a Multiply-and-Accumulate (MAC) circuit comprises a successive approximation circuit (SAR) capacitor, an AND gate, an inverter, and a multiplexer.

In embodiments, the comparator compares a reference voltage Via to an output voltage of the plurality of MAC circuits. In embodiments, an output of the comparator is an input to the state machine.

In embodiments, the successive approximation register (SAR) further comprises at least seven reset switches $S_1$-$S_7$.

In embodiments, the bit-wise multiplication of a digital weight matrix with a digital input vector is performed by the successive approximation registers (SAR) using only the successive approximation register (SAR) capacitors.

In embodiments, the successive approximation register (SAR) further comprises a successive approximation register (SAR) local memory. In embodiments, the successive approximation register (SAR) local memory is configured to store bit-wise weight values.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

BRIEF DESCRIPTION OF THE DRAWINGS

The following Detailed Description, Figures, and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIGS. 4A, 4B, 4C, 4D, 4E, 4F, 4G, and 4H (collectively referred to herein as "FIG. 4") illustrate an exemplary 3-bit implementation of an exemplary switched capacitor matrix multiplier according to embodiments of the present disclosure.

FIG. 5 illustrates a method by which the worst-case error in a MAC result can be calculated for an incomplete MAC operation.

Figure 1:
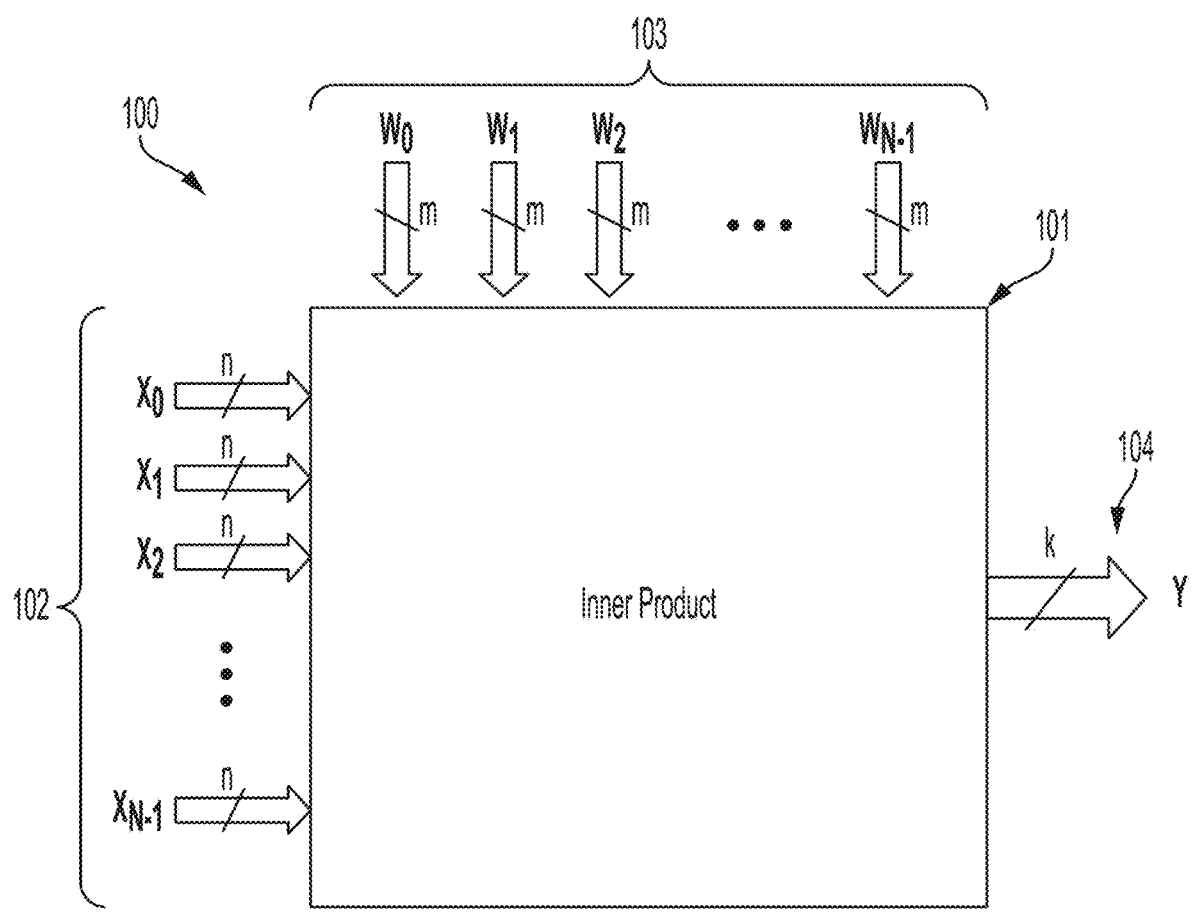
FIG. 1 illustrates a top-level diagram of an exemplary switched capacitor vector-vector inner multiplier.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

A general-purpose low power switched capacitor Vector-Matrix Multiplier (VMM) is presented. The vector-matrix multiplier computes N inner products of n-dimensional inputs with m-dimensional weights in parallel. A significant power efficiency is achieved by performing multiply-and-accumulate in analog domain and storing weight values locally so that power hungry data communication between memory and computational unit is eliminated $$Y_{1 \times N}^{(n)} = X_{1 \times N}^{(n)} \cdot W_{N \times N}^{(m)} \quad (1)$$

Inner product multiplication described by Equation (1), can be expanded in a bit-wise fashion as follows:

$$y = \Sigma \Sigma_{k=0}^{m-1} (\Sigma_{=0}^{n-1} (\Sigma i = 0^{N-1} x_i^j \cdot w_i^k) \cdot 2^j) \cdot 2^k \quad (2)$$

where N is the number of inputs and weights, n is the number of bits in the inputs, m is the number of bits in the weights, $x_i^j$ is the j-th bit of the i-th input and $w_i^k$ is k-th bit of the i-th weight.

Generally, N, n and m set an upper limit on k (output resolution) in Equation (1):

$$k \leq n+m+\log_2(N) \quad (3)$$

For n-bit inputs and m-bit weights there will be n·m cycles required to compute the result. However, if k is set to anything lower than its upper limit, not all cycles will be necessary. For example, for a 256-input inner product multiplier with 8-bit inputs, weights and outputs and a SAR with 8-bit resolution, there will be only 49 (as opposed to 64) cycles required to guarantee that the approximated MAC result is within one Least Significant Bit (LSB) from its true value in the worst case where all inputs and weight are 255 (for random inputs and weights this further reduces to only 36 cycles). FIG. 5 illustrates a method by which the worst-case error for the example mentioned above can be calculated. Accordingly, the worst-case error after 49 cycles will be:

$$\frac{5 \times 2^{-12} + 4 \times 2^{-13} + 3 \times 2^{-14} + 2 \times 2^{-15} + 1 \times 2^{-16}}{2^{-8}} \approx 0.5\, LSB \quad (4)$$

Output resolutions higher than SAR's resolution can be achieved by running the SAR quantization on partial MAC results one or more times throughout MAC operation. For example, a 16-bit output can be achieved by running SAR quantization once for every 8 MAC cycles and then scaling and summing the results in the digital domain. This way, any output resolution from 1 to n+m+log$_2$ (N) can be achieved with this architecture.

An analog implementation provides a natural medium to implement fully parallel computational arrays with high integration density and energy efficiency. By summing charges on each capacitor in a large capacitor bank, a switched capacitor vector-matrix multiplier can accomplish a massively parallel multiply-and-accumulate (MAC) with low latency.

The switched capacitor vector-matrix multiplier comprises a Successive Approximation Register (SAR) Analog to Digital Converter (ADC) per input. The capacitor bank of each SAR is not binary weighted and is expanded to provide one connection per input. Inputs and weights are implemented digitally in bit-serial fashion. SAR architecture according to certain embodiments provides a low power solution that inherently contains both a DAC and an ADC. The ADC quantizes the result of each MAC operation which can be used as an input to the next stage while DAC converts the digital codes back into analog charges which are accumulated in MAC operation. This process makes this architecture highly scalable and can be cascaded many times to implement a very large neural network. Carrying out quantization by a SAR ADC has an added advantage of dynamically lowering the resolution of the results for applications that require faster and more power efficient but less precise computations. An N×N matrix multiplier can be constructed by an array of N switched capacitor vector-vector inner multiplier each with N inputs and a log 2(N) bit resolution SAR. The distributed nature of local storage of the results absolves the need for high bandwidth memory and significantly increases the power efficiency of the system. Moreover, storing the results digitally allows for reconfigurable digital post-processing and can be used to apply non-linearity.

Multiplication of matrices larger than the physical structure of a switched capacitor matrix multiplier can be accomplished by performing partial matrix multiplication of the size of the available switched capacitor matrix multiplier and then storing and recombining the partial results locally.

The digital interface of SAR's capacitive DAC inputs and the state machine outputs can be modified to incorporate inner product computation into SAR. By multiplexing the SAR's state machine's digital outputs with bit-wise product of inputs and weights, SAR can operate in two separate phases: Accumulation phase in which inputs and weights are bit-wise multiplied using simple AND gates and results accumulated on the shared node of the capacitive DAC, and Conversion phase in which normal SAR operation results in digital quantization of the accumulated result. By scaling down the previous MAC result by a factor of two and adding it to the MAC result of next consecutive bit of inputs or weights before SAR quantization starts, more resolution can be incorporated into the final MAC output. This way, resolution of inputs and weights can be set arbitrarily high and on the fly, though at the expense of energy and speed.

The digital interface of SAR's DAC inputs and the state machine outputs can be further exploited to embed memory into the system. By storing weights locally using cross-coupled inverters, memory access and computations can be carried out locally and at the same time obviating the need for energy-expensive data movements to and from memory. Such distributed memory system can be thought of as a Static Random Access Memory (SRAM) with embedded bit-wise multipliers (AND gates) whose memory cells are capacitively coupled to the bit-lines (the shared node of the capacitive DAC) through unit capacitors of the SAR. This way, all bits stored in the SRAM can be read simultaneously as long as SAR has enough precision to resolve the amount of charge injected by a single memory cell. Because of this In-Memory-Computation, a significant area and power saving can be achieved.

FIG. 1 illustrates a top-level diagram of an exemplary switched capacitor vector-vector inner multiplier 100. In FIG. 1, multiplier 100 computes N inner products 101 of n-bit inputs ($X_0 \ldots X_{N-1}$) 102 with m-bit weights ($W_0 \ldots W_{N-1}$) 103 in parallel. Multiplier 100 produces one k-bit output (Y) 104.

Figures 2A, 2B:
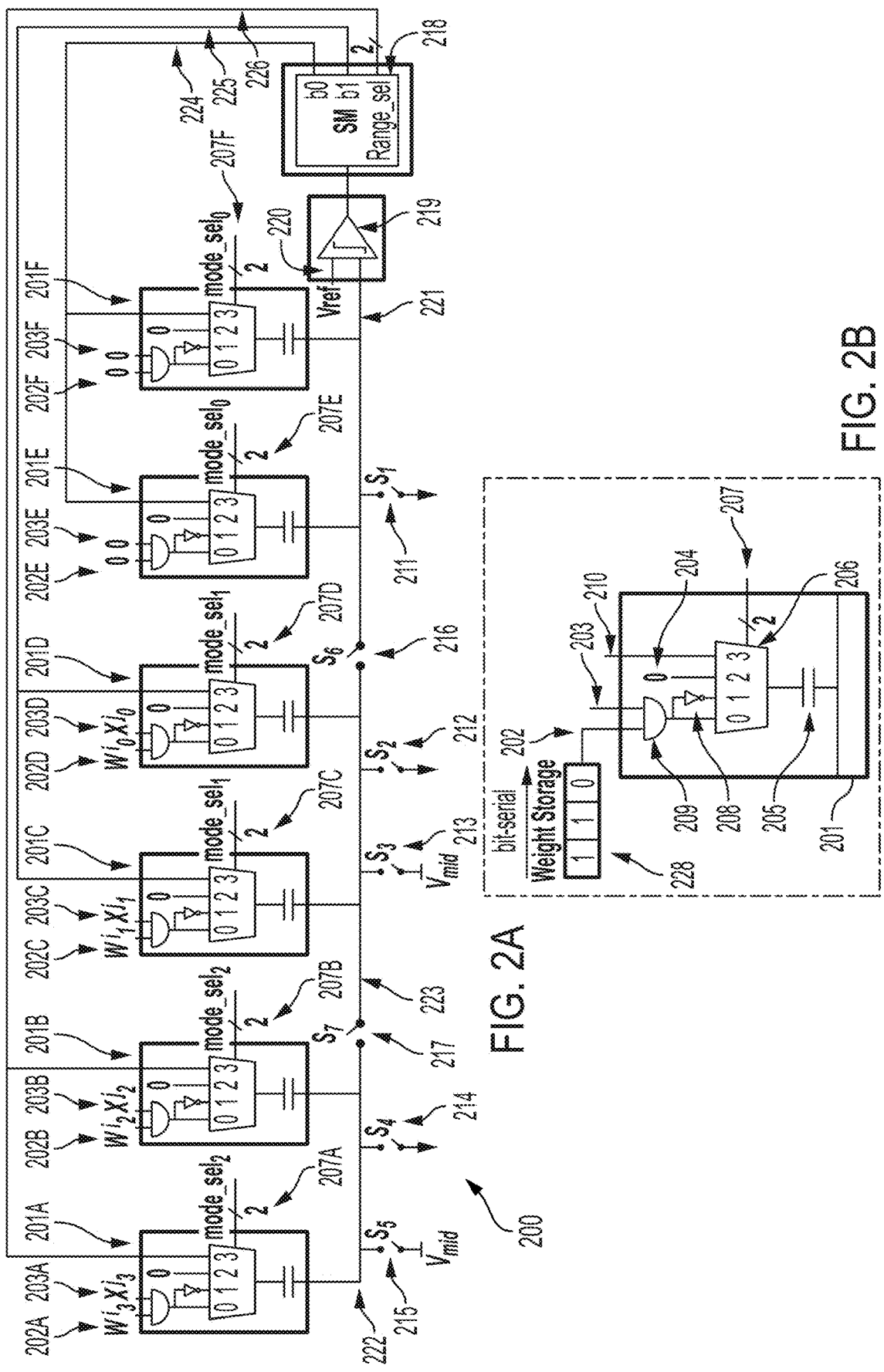
FIGS. 2A, 2B, and 2C illustrate an exemplary implementation of an exemplary successive approximation register (SAR) for use with embodiments of the present disclosure.

FIG. 2A illustrates an exemplary implementation of an exemplary successive approximation register (SAR) 200 for use with embodiments of the present disclosure. An exemplary SAR comprises a plurality of (e.g., six (6) in FIG. 2A) MAC circuits 201A-201F connected in parallel. Each of MAC circuits 201A-201F (shown in blown up 201 in FIG. 2B) comprises a multiplexer 206, a capacitor 205, successive approximation register (SAR) local memory 228 for storing weight values, an AND gate 209, and an inverter 208 where the AND gate and the inverter are connected in series. A 2-bit input 207 to the multiplexer 206 selects between the output of the AND gate 209 for value '0', output of the inverter 208 for value '1', ground 204 for value '2', or an input 210 from SAR state machine 218 for value '3' and drives the SAR capacitor 205.

In embodiments, SAR 200 further comprises reset switches $S_1$-$S_7$ 211-217. Switches $S_4$ 214 and $S_5$ 215 connect the shared output of MAC circuits 201A and 201B 222 to ground and $V_{mid}$ respectively. $V_{mid}$ is set to half of SAR supply voltage. Switches S2 212 and $S_3$ 213 connect the shared output of MAC circuits 201C and 201D 223 to ground and $V_{mid}$ respectively. A switch $S_1$ 211 connects the shared output of MAC circuits 201E and 201F 221 to ground. A switch $S_6$ 216 connects the shared output of MAC circuits 201E and 201F 221 to the shared output of MAC circuits 201C and 201D 223. A switch $S_7$ 217 connects the shared output of MAC circuits 201A and 201B 222 to the shared output of MAC circuits 201C and 201D 223. The timing diagram 227 illustrates the orientation of the switches $S_1$-$S_7$ in Analog MAC operation and Quantization stages of the matrix multiplier. Signals $\varphi_1$-$\varphi_7$ drive switches $S_1$-$S_7$ respectively such that when signals $\varphi_1$-$\varphi_7$ are high $S_1$-$S_7$ are closed and when signals $\varphi_1$-$\varphi_7$ are low $S_1$-$S_7$ are open.

In embodiments, SAR 200 further comprises a comparator 219 and a state machine 218. Comparator 219 compares a reference voltage V re f 220 to an output voltage 221 of the MAC circuits 201E-201F to provide an input for the state machine SM 218. State machine SM 218 provides an output b0 224 that is fed back to a MAC circuit 201E, an output b1 225 that is fed back to MAC circuits 201C and 201D, and a 2-bit output Range_sel where one bit is fed back to MAC circuit 201A and the other bit is fed back to MAC circuit 201B.

In embodiments, SAR 200 further comprises 2-bit signals mode_sel$_0$, mode_sel$_1$, mode_sel$_2$. mode_sel$_0$ is connected to multiplexer select signal 207E and 207F of MAC circuits 201E and 201F, mode_sel$_1$ is connected to multiplexer select signal 207C and 207D of MAC circuits 201C and 201D, mode_sel$_2$ is connected to multiplexer select signal 207A and 207B of MAC circuits 201A and 201B. The timing diagram 227 illustrates the value of mode_sel$_0$, mode_sel$_1$, mode_sel$_2$ in MAC and quantization stages of switched capacitor matrix multiplier.

Figure 3A:
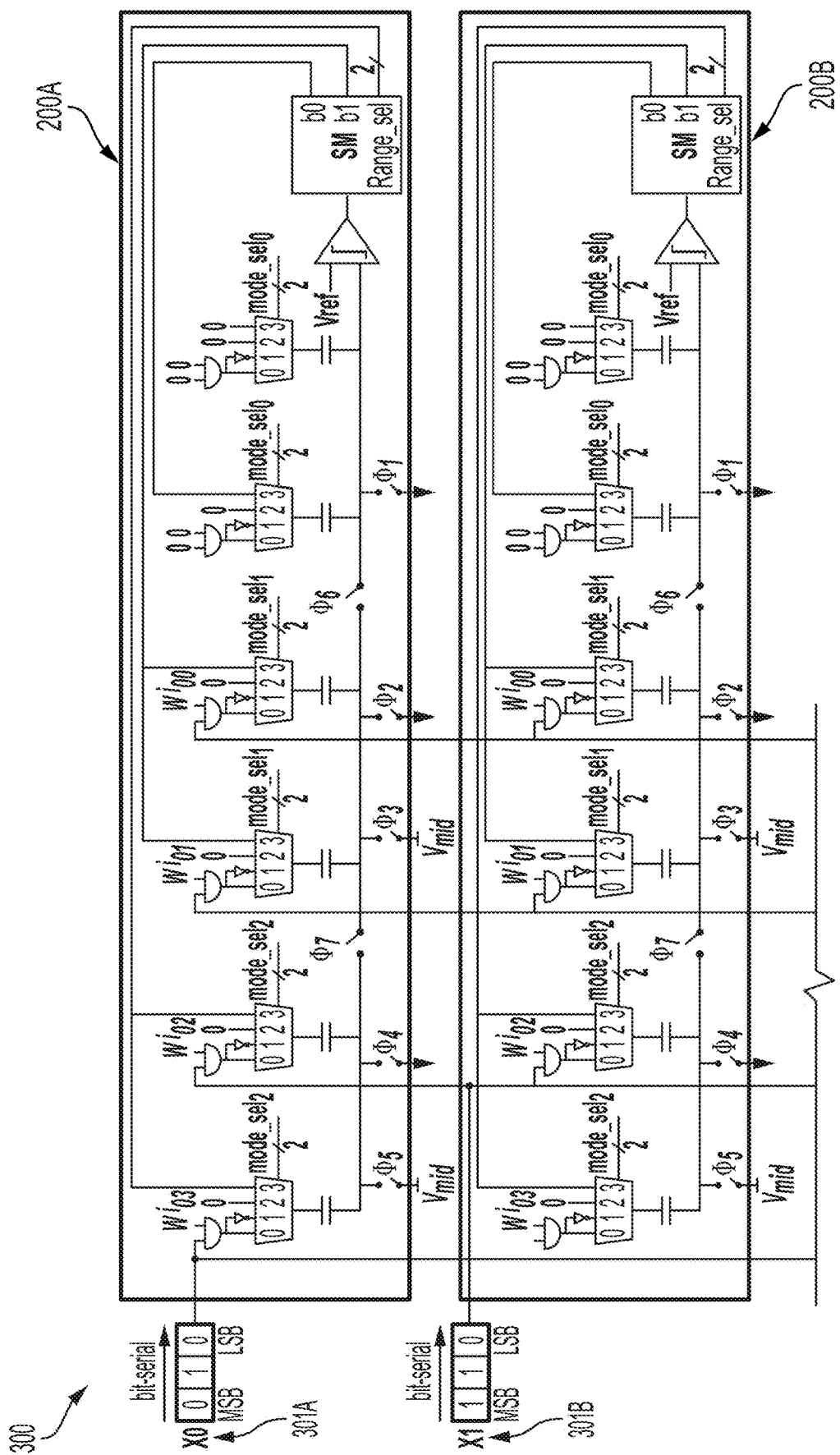
FIGS. 3A and 3B (collectively referred to herein as "FIG. 3") illustrate a 2-bit implementation of an exemplary switched capacitor matrix multiplier, in accordance with embodiments of the present disclosure.
Figure 3B:
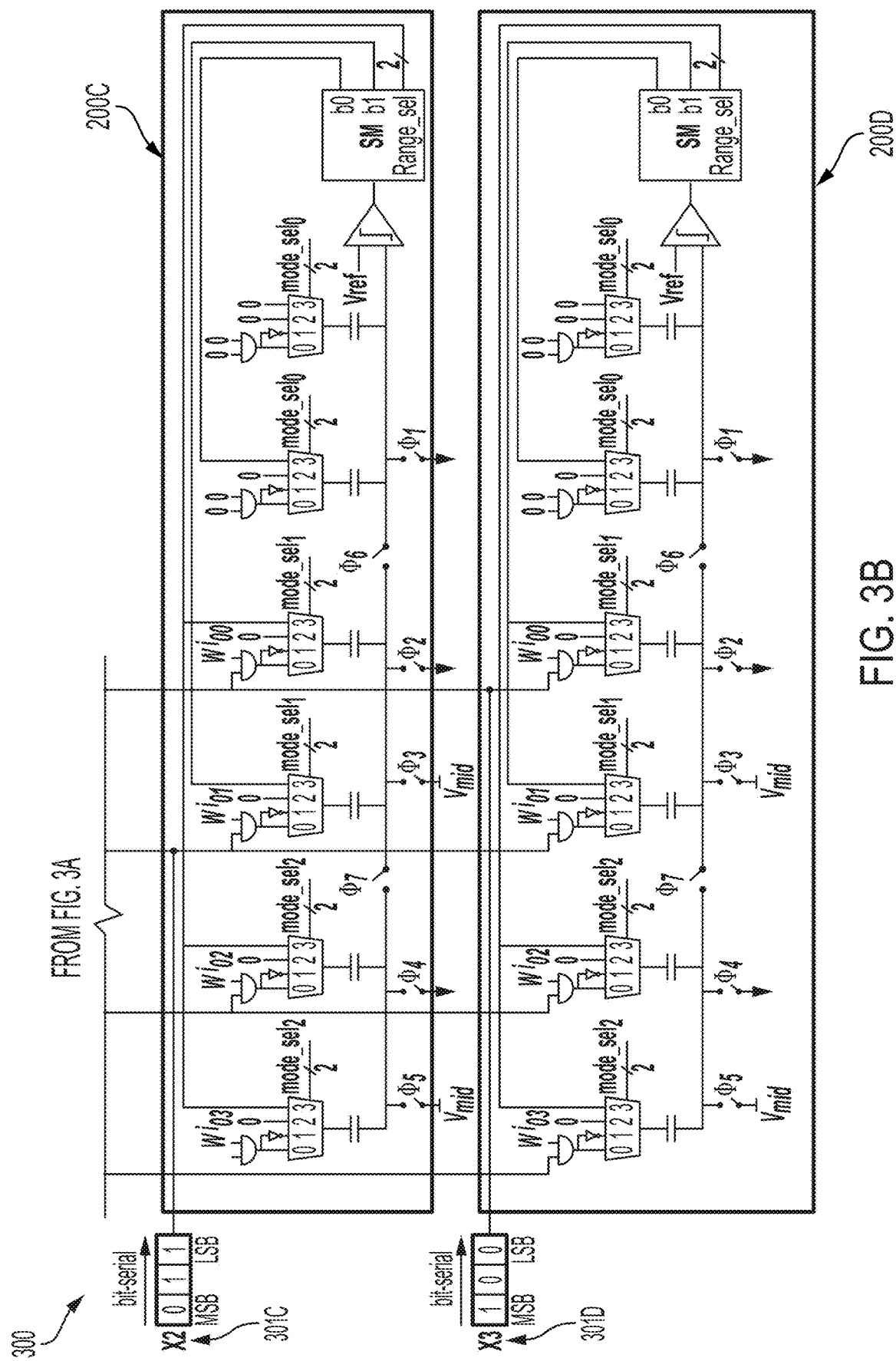
Figure 4A:
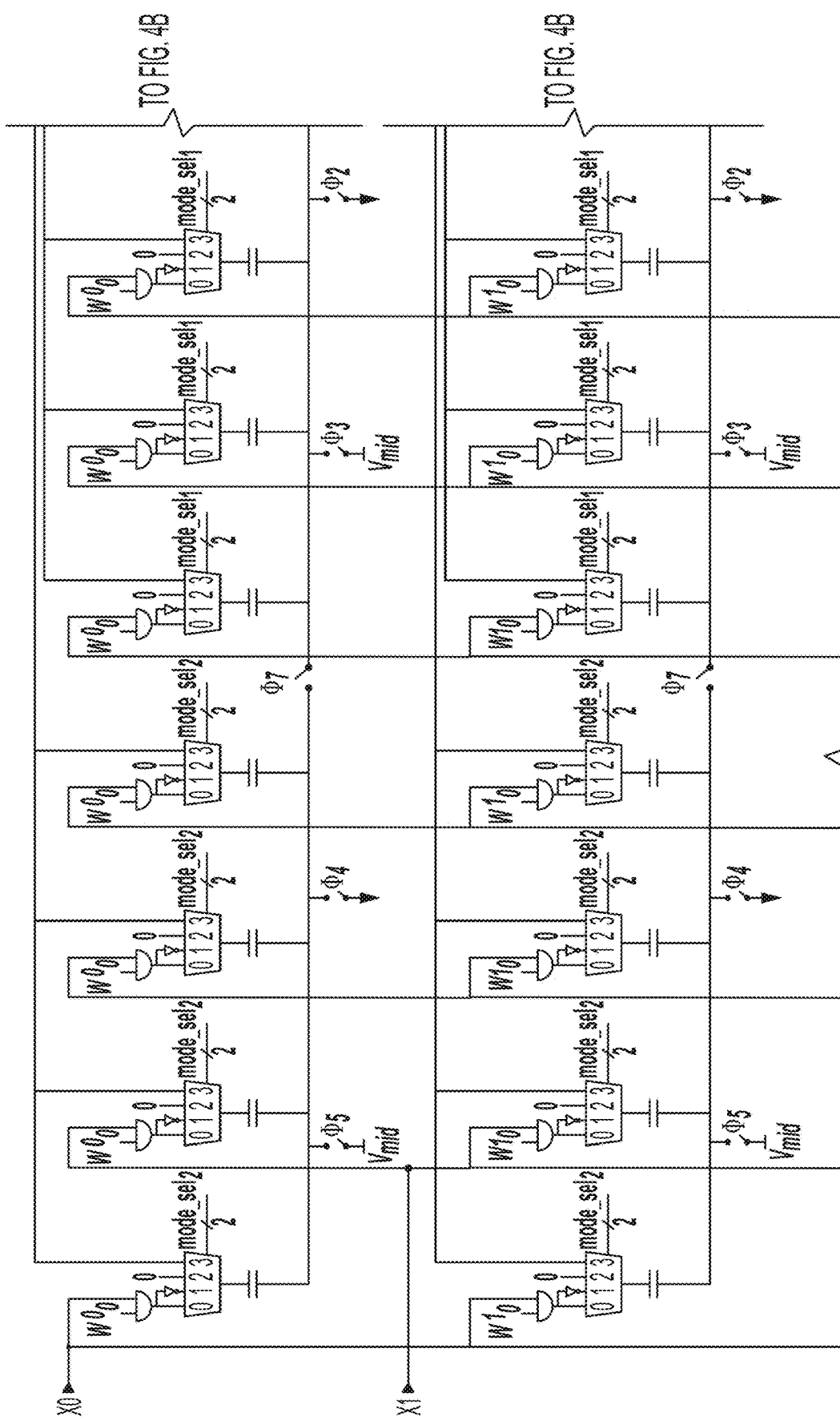
Figure 4B:
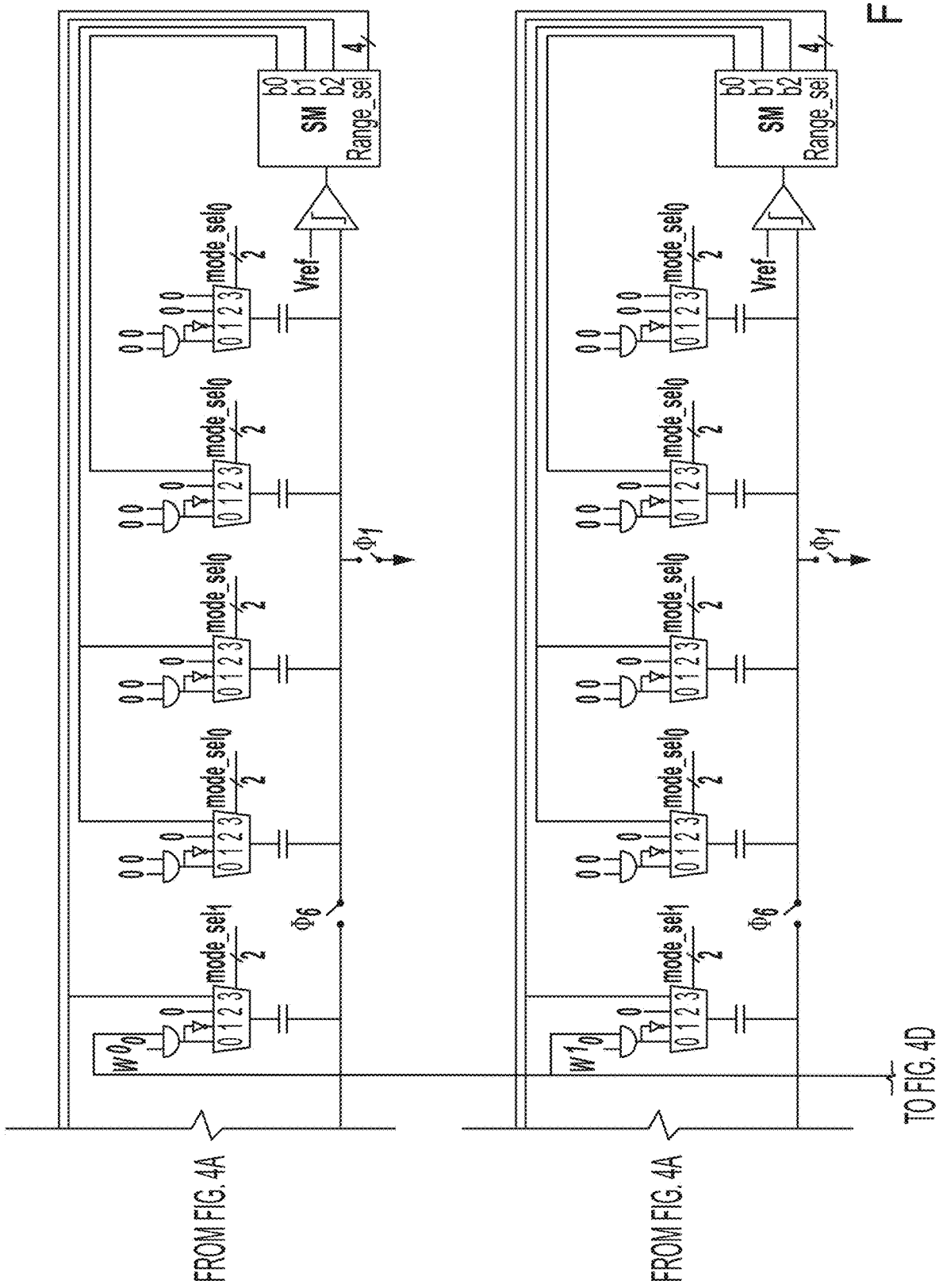
Figure 4C:
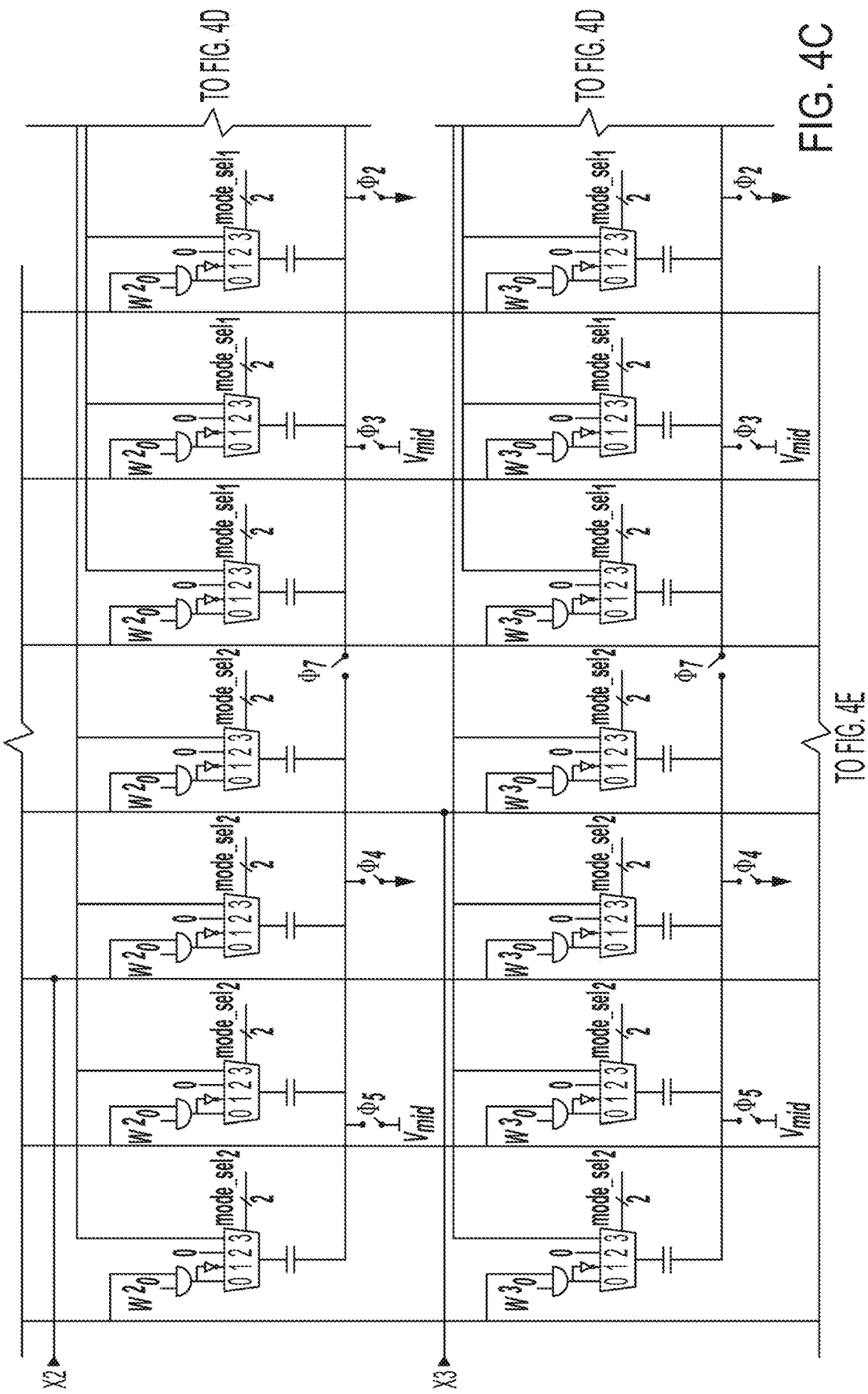
Figure 4D:
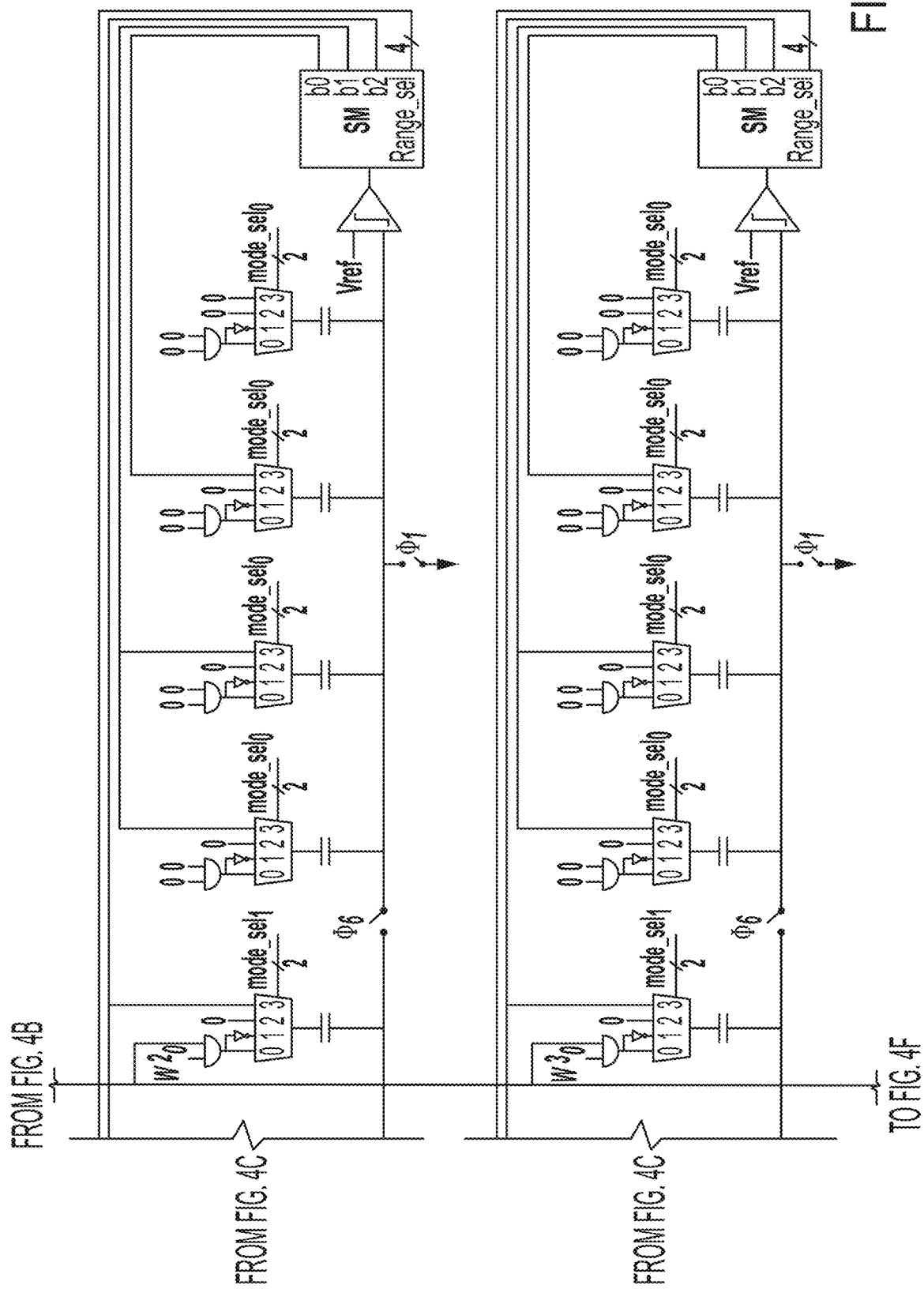
Figure 4E:
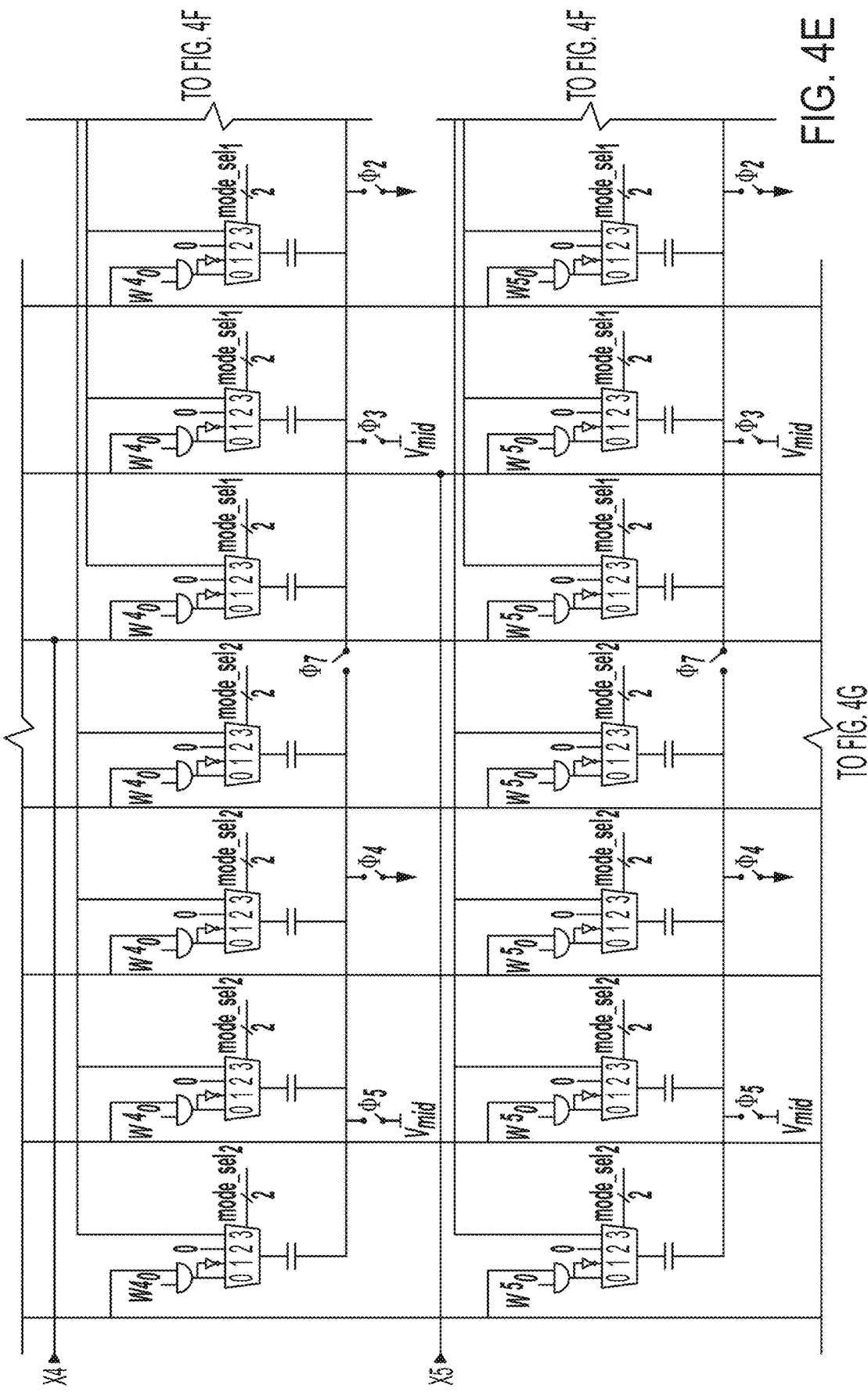
Figure 4F:
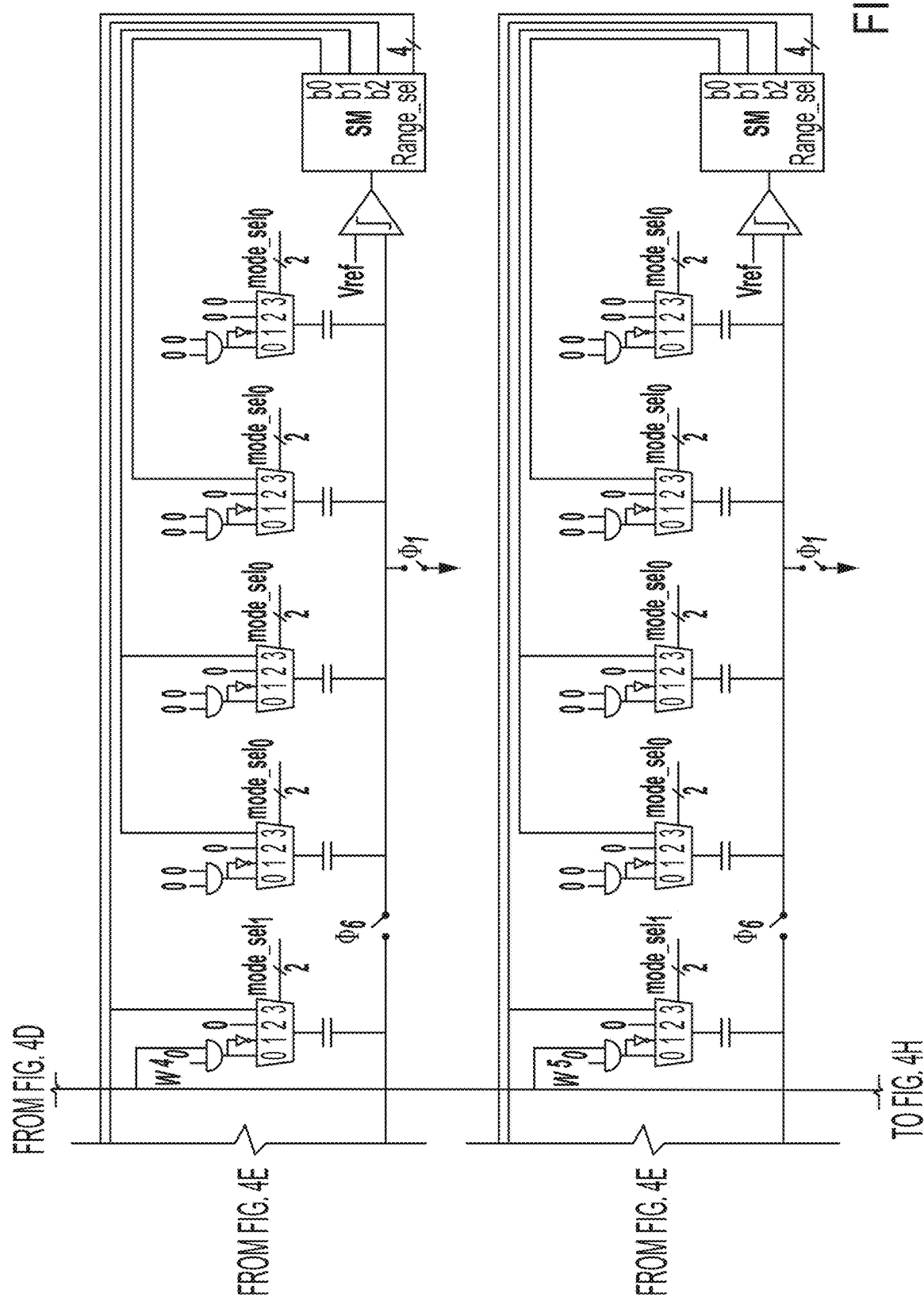
Figure 4H:
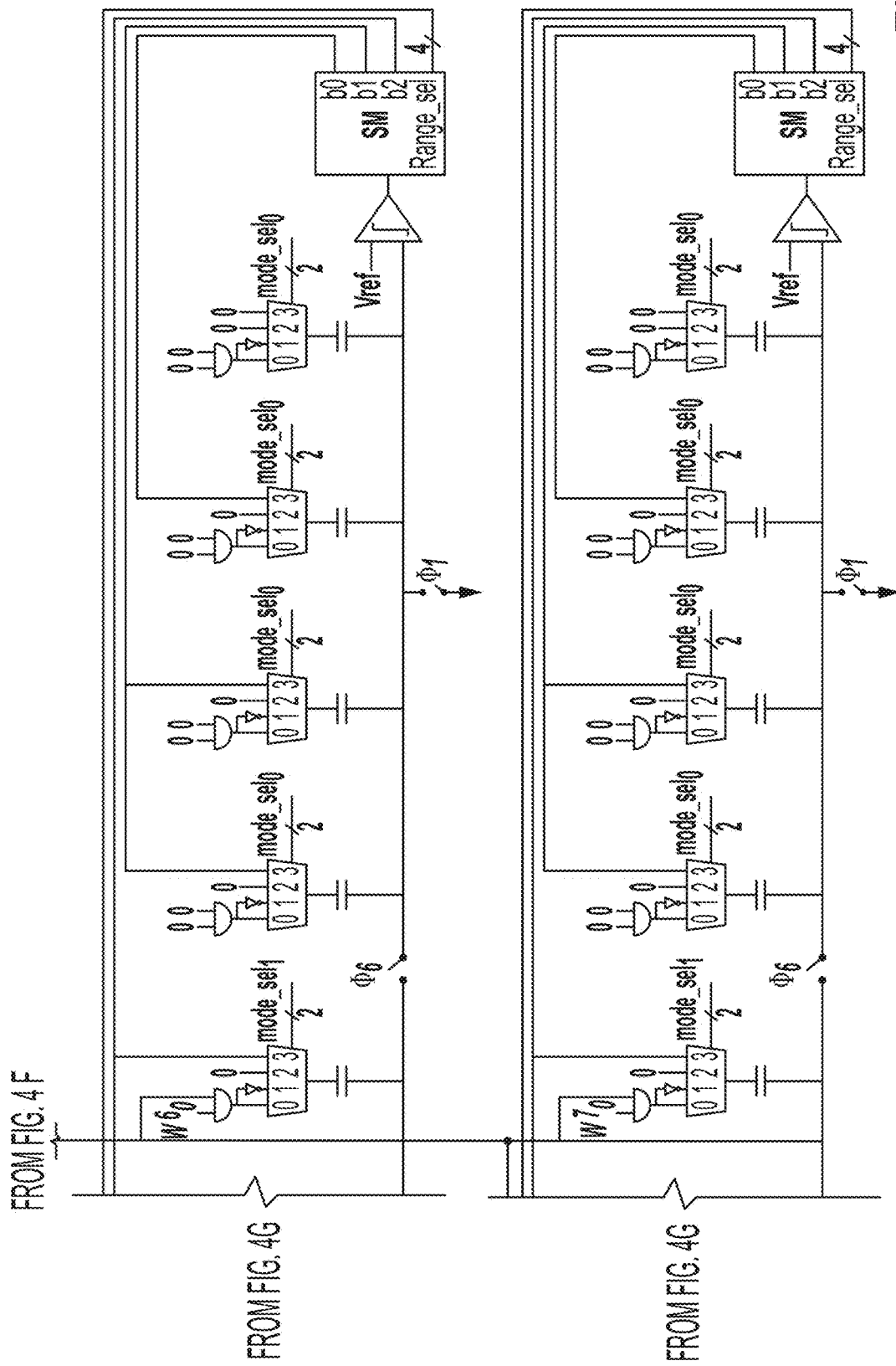

FIG. 3 illustrates a 2-bit implementation of an exemplary switched capacitor matrix multiplier 300 in accordance with embodiments of the present disclosure. In embodiments, switched capacitor matrix multiplier 300 comprises a plurality of SARs 200A-200D (e.g., four (4) in FIG. 3), each having a configuration as described with respect to and depicted in FIG. 2A.

In embodiments, switched capacitor matrix multiplier 300 further comprises a plurality of (e.g., four (4) in FIG. 3) local memory 301A-301D for storing input values.

FIG. 4 illustrates an exemplary 3-bit implementation of an exemplary switched capacitor matrix multiplier 400 according to embodiments of the present disclosure. As shown therein, switched capacitor matrix multiplier 400 comprises a plurality of SARs (e.g., eight (8), as shown in FIG. 4), each having a configuration similar to that discussed above in reference to FIG. 2A. However, as shown in FIG. 4, each SAR may comprise twelve (12) MAC circuits each having a functionality similar to that discussed above. Such a configuration provides a matrix multiplier having a different resolution and number of inputs to that shown in FIG. 2. Specifically, the configuration of FIG. 4 provides a 3-bit matrix multiplier configured for utilizing 8 inputs. It should be understood that the 2-bit matrix multiplier configuration of FIG. 2 and the 3-bit matrix multiplier of FIG. 4 are merely examples of various matrix multiplier configurations that may embody various embodiments.

FIG. 5 illustrates a method by which the worst-case error in a MAC result can be calculated for an incomplete MAC operation. By summing the numbers in the diagram starting from upper right corner and moving down and to the left one can calculate the worst case error in an incomplete MAC operation.

It will be appreciated that "weight" and "bit-wise" weight are used herein interchangeably.

Exemplary Multiply-and-Accumulate (MAC) and Quantization Operation

Figure 2C:
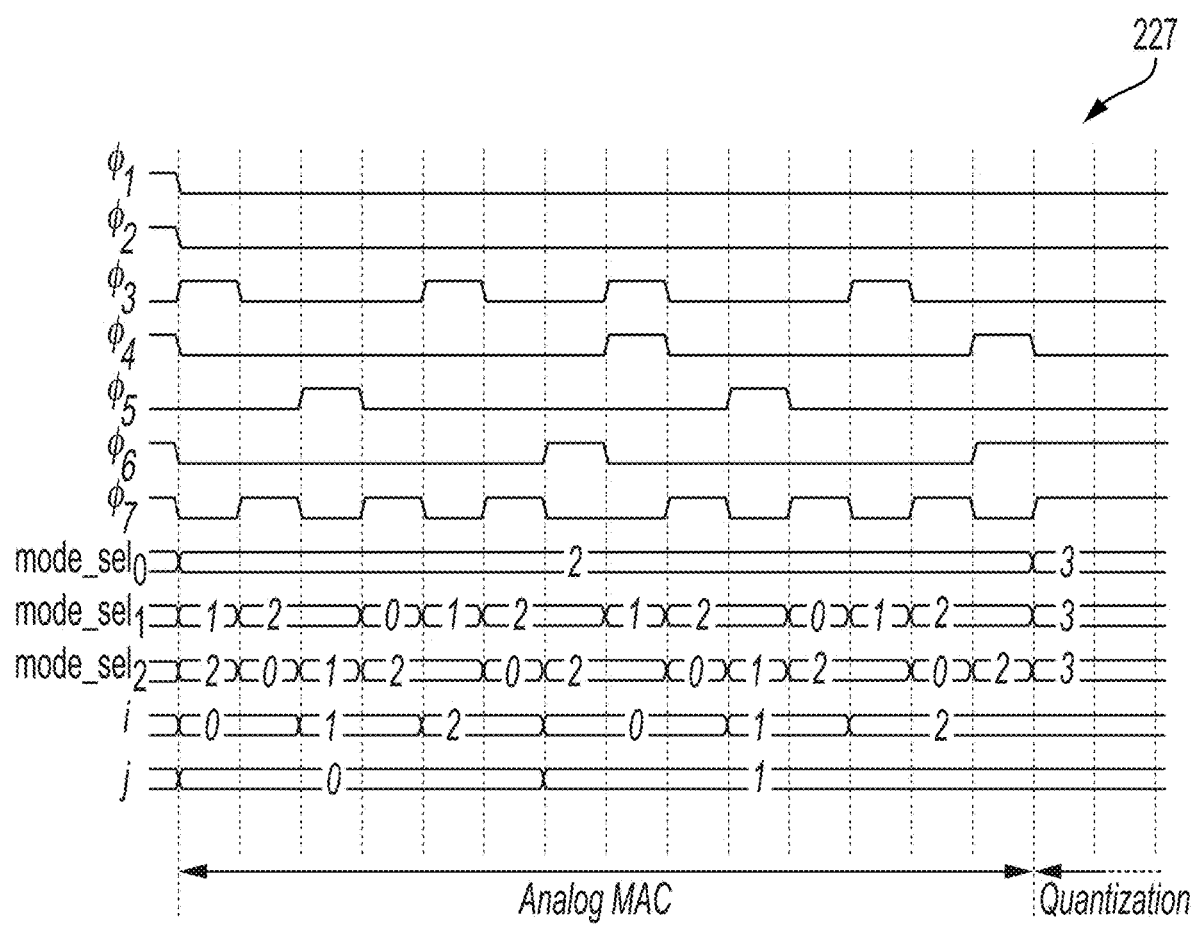

MAC stage or operation of the exemplary switched capacitor vector matrix multiplier starts by multiplying the Least Significant Bit (LSB) of inputs and weights (k=j=0) and shorting the shared node of MAC circuits 201C and 201D (e.g., 223 in FIG. 2A) to $V_{mid}$ through $S_3$ (e.g., 213 in FIG. 2A) while shorting the top plates of the SAR capacitors (e.g., 205 in FIG. 2B) in MAC circuits 201C and 201D to the output of inverter (e.g., 208 in FIG. 2B) by setting mode_sel$_1$ to '1'. The shared nodes of MAC circuits 201A and 201B (e.g., 222 in FIG. 2A) and MAC circuits 201E and 201F (e.g., 221 in FIG. 2A) are shorted to ground via switches $S_4$ (e.g., 214 in FIG. 2A) and $S_1$ (e.g., 211 in FIG. 2A) respectively and mode_sel$_0$ and mode_sel$_2$ are set to '2'. Switches $S_6$ (e.g., 216 in FIG. 2A) and $S_7$ (e.g., 217 in FIG. 2A) are open. The switch $S_7$ then closes shorting nodes 222 and 223 in FIG. 2A and top plates of SAR capacitors in MAC circuits 201C and 201D are shorted to ground by setting mode_sel$_1$ to '2'. The top plates of SAR capacitors in MAC circuits 201A and 201B are shorted to the output of AND gate (e.g., 209 in FIG. 2B) by setting mode_sel$_2$ to '0'. $S_7$ then opens and bit index of inputs is incremented by one (e.g., 203 in FIG. 2B). The bottom plates of capacitors in MAC circuits 201A and 201B are shorted to $V_{mid}$ through $S_5$ (e.g., 215 in FIG. 2A) and top plates to the output of inverter (e.g., 208 in FIG. 2B) by setting mode_sel$_2$ to '1' while the SAR capacitors in MAC circuits 201C and 201D are holding the result of the previous MAC operation. When $S_7$ closes again and mode_sel$_1$ and mode_sel$_2$ are set to '0' and '2' respectively, new charge is added to the SAR capacitors of the MAC circuits 201A-D and the previously stored charge on the SAR capacitors of MAC circuits 201C and 201D is now shared between SAR capacitors of MAC circuits 201A-D. Therefore, the previous MAC result is halved and accumulated with the new MAC result. This pattern repeats scaling the previous result by a factor of two and accumulating it with the new MAC result every time $S_7$ closes then incrementing bit index of inputs until all bits in the input are multiplied by the LSB of the weights. Then $S_7$ opens and $S_6$ closes dividing the accumulated result by two and storing it on SAR capacitors of the MAC circuits 201E and 201F. This pattern repeats incrementing bit index of weights by one every time until all bits of weights are multiplied by all bits of inputs. Timing diagram 227 in FIG. 2C illustrates the MAC operations where n=3 and m=2 in Equation (1).

In a quantization stage/operation/process of the exemplary switched capacitor vector matrix multiplier, mode_sel$_0$, mode_sel$_1$ and mode_sel$_2$ are set to '3' and switches $S_1$-$S_5$ are open and switches $S_6$ and $S_7$ are closed. Normal SAR operation results in quantization of final MAC result. Range_sel can be used to set the overflow or underflow of the MAC result dynamically or to incorporate a threshold in matrix multiplication.

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein are chosen to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed is:

1. A switched capacitor matrix multiplier, comprising:
    a plurality of successive approximation registers (SAR) operating in parallel, each SAR having a SAR digital output; and
    a plurality of Analog Multiply-and-Accumulate (MAC) units for multiplying and accumulating and scaling bit-wise products of a digital weight matrix with a digital input vector, each MAC unit is connected in series to a SAR of the plurality of SARs.

2. The switched capacitor matrix multiplier of claim 1, wherein a successive approximation register comprises:
    a comparator; and
    a state machine.

3. The switched capacitor matrix multiplier of claim 2, wherein each of the MAC circuits comprises:
    a SAR capacitor, an AND gate, an inverter, and a multiplexer.

4. The switched capacitor matrix multiplier of claim 3, wherein the bit-wise multiplication of a digital weight matrix with a digital input vector is performed by the SARs using only the SAR capacitors.

5. The switched capacitor matrix multiplier of claim 3, wherein the SAR further comprises a SAR local memory.

6. The switched capacitor matrix multiplier of claim 5, wherein the SAR local memory is configured to store bit-wise weight and input values.

7. The switched capacitor matrix multiplier of claim 2, wherein the comparator compares a reference voltage Vref to an output voltage of the plurality of MAC circuits.

8. The switched capacitor matrix multiplier of claim 2, wherein an output of the comparator is an input to the state machine.

9. The switched capacitor matrix multiplier of claim 2, wherein the SAR further comprises seven reset switches.

* * * * *